United States Patent
Chang et al.

(10) Patent No.: US 9,678,829 B2
(45) Date of Patent: *Jun. 13, 2017

(54) MEMORY DEVICE AND ERASING METHOD THEREOF

(71) Applicant: MACRONIX INTERNATIONAL CO., LTD., Hsinchu (TW)

(72) Inventors: Chin-Hung Chang, Tainan (TW); Chia-Feng Cheng, Hsinchu (TW); Yu-Chen Wang, Kaohsiung (TW); Ken-Hui Chen, Hsinchu (TW); Kuen-Long Chang, Taipei (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/185,066

(22) Filed: Jun. 17, 2016

(65) Prior Publication Data

US 2016/0292031 A1 Oct. 6, 2016

Related U.S. Application Data

(63) Continuation of application No. 14/160,612, filed on Jan. 22, 2014, now Pat. No. 9,400,712.

(51) Int. Cl.
*H03M 13/00* (2006.01)
*G06F 11/10* (2006.01)
*G11C 16/16* (2006.01)
*G11C 29/42* (2006.01)
*G11C 16/00* (2006.01)
*G11C 16/34* (2006.01)
*G11C 11/56* (2006.01)
*G11C 16/14* (2006.01)

(52) U.S. Cl.
CPC ...... *G06F 11/1044* (2013.01); *G06F 11/1068* (2013.01); *G06F 11/1076* (2013.01); *G11C 11/5635* (2013.01); *G11C 16/00* (2013.01); *G11C 16/14* (2013.01); *G11C 16/16* (2013.01); *G11C 16/3404* (2013.01); *G11C 29/42* (2013.01); *G06F 2212/403* (2013.01)

(58) Field of Classification Search
CPC ............ G06F 11/1068; G06F 11/1072; G06F 11/1044; G06F 11/1076; G11C 16/16; G11C 16/0483; G11C 29/42; G11C 11/5635

See application file for complete search history.

(56) References Cited

U.S. PATENT DOCUMENTS

| | | | |
|---|---|---|---|
| 5,790,460 A | 8/1998 | Chen et al. | |
| 7,952,958 B2* | 5/2011 | Yanagidaira | G11C 16/349 365/185.09 |
| 8,315,093 B2 | 11/2012 | Dong et al. | |

(Continued)

*Primary Examiner* — Shelly A Chase
(74) *Attorney, Agent, or Firm* — McClure, Qualey & Rodack, LLP

(57) ABSTRACT

An erasing method of a memory device is provided. The memory device includes a memory controller and a memory array having a first memory region and a second memory region. The first memory region and the second memory region share the same well. The erasing method comprising steps of: erasing the first memory region; and selectively programming the second memory region according to an error correction code algorithm.

19 Claims, 5 Drawing Sheets

(56) References Cited

U.S. PATENT DOCUMENTS

| | | | |
|---|---|---|---|
| 2011/0205810 A1* | 8/2011 | Kasai | G11C 16/0483 365/185.33 |
| 2011/0305084 A1 | 12/2011 | Park | |
| 2013/0182509 A1* | 7/2013 | Lee | G11C 16/3459 365/185.22 |
| 2013/0272067 A1* | 10/2013 | Lee | G11C 16/0483 365/185.11 |
| 2014/0310569 A1* | 10/2014 | Bloom | G06F 11/1052 714/763 |

* cited by examiner

MEMORY DEVICE AND ERASING METHOD THEREOF

This application is a continuation application of U.S. application Ser. No. 14/160,612, filed Jan. 22, 2014, the contents of which are incorporated herein by reference.

FIELD OF THE INVENTION

Background of the Invention

The electronic devices currently available in the market, such as mobile phones, tablet PCs, automotive electronic products, are equipped with non-volatile storage devices. Flash memory is an electronic non-volatile computer storage medium that retains content without consuming power. Correctness of data stored in flash memory is important. Accordingly, it is desirable to avoid potential data loss in flash memory.

SUMMARY OF THE INVENTION

An embodiment of the present invention provides an erasing method of a memory device comprising a memory array, having a first memory region and a second memory region, wherein the first memory region and the second memory region share the same well, the erasing method comprising steps of: erasing the first memory region; and selectively programming the second memory region according to an error correction code algorithm.

Another embodiment of the present invention provides a memory device, comprising: a memory controller; and a memory array, electrically connected to the memory controller and comprising a first memory region and a second memory region sharing a well, wherein the first memory region is erased by the memory controller and the second memory region is selectively programmed according to an error correction code algorithm.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a flash memory device and an erasing method thereof. The flash memory device includes a memory array and a memory controller. The memory array is constructed of plural flash memory cells in which one or more bits of data are stored and accessed.

Figure 1:
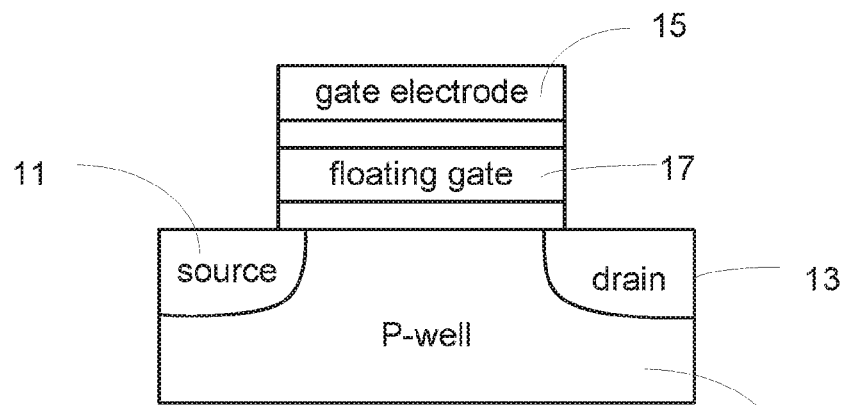
FIG. 1 is a cross-sectional view of a flash memory cell.

FIG. 1 is a cross-sectional view of a flash memory cell. Referring to FIG. 1, the flash memory cell includes a p-well 10, a source region 11 and a drain region 13 formed on both sides of the p-well 10 and a gate structure. The gate structure includes a gate electrode 15 and a floating gate 17.

Typical operations of a flash memory may be divided into a program (write) operation, an erase operation, and a read operation. In order to be accurately programmed, read, and/or erased, flash memory cells are addressed with bitlines and wordlines. Erase operation of flash memory is performed block by block and a block to be erased is selected by a wordline.

During an erase operation, a negative voltage is applied to a wordline corresponding to a block to be erased. In other words, a negative voltage is applied to the gate electrode 15 of the flash memory cells in the block to be erased. Also, a positive voltage is applied to the p-well 10 of the block to be erased. Therefore, a voltage difference of erasing is formed between the p-well and 10 and the floating gate 17 of the flash memory cells in the block to be erased. On the other hand, voltage of the wordline corresponding to a block no to be erased remains as ground (0 volt).

Figure 2:
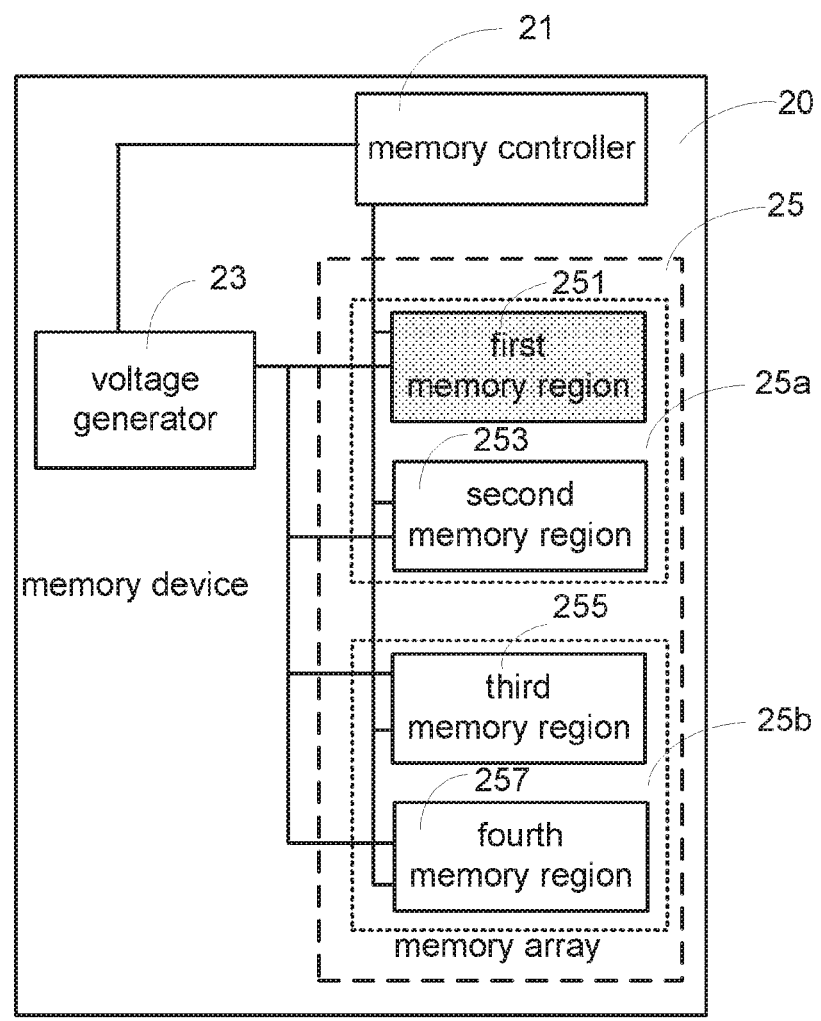
FIG. 2 is a schematic functional block diagram illustrating an exemplary memory device.

FIG. 2 is a schematic functional block diagram illustrating an exemplary memory device. The memory device 20 includes a memory controller 21, a voltage generator 23, and a memory array 25. The memory controller 21 may read, program, or erase the memory regions and the voltage generator 23 provides corresponding programming voltage, or erasing voltage etc.

The memory array 25 may be divided into plural memory regions (e.g. blocks). It is assumed the memory array 25 includes a first portion 25a and a second portion 25b. Each portion of the memory array 25 corresponds to a well and includes several memory regions. That is, several memory regions are formed on a single well and share a well. The well shared by the memory regions may be a p-well or an n-well.

As shown in FIG. 2, the first portion 25a of the memory array 25 contains a first memory region 251 and a second memory region 253. The second portion 25b of the memory array 25 contains a third memory region 255 and a fourth memory region 257. It is assumed that first memory region 251 and the second memory region 253 share same well. Similarly, the third memory region 255 and the fourth memory region 257 share another well.

According to the above illustration, when the first memory region 251 is selected to be erased, a positive voltage is applied to the well corresponding to the first memory region 251. Based on the above illustrations, the first memory region 251 and the second memory region 253 are associated as same well is shared together.

Thus, even if the second memory region 253 is not selected, a small voltage difference is formed between gate electrode and well of the memory cells of the second memory region 253. Consequentially, the small voltage difference forms a weak erasure effect on the memory cells of the second memory region 253. With the weak erasure effect, data contents of the memory cells of the second memory region 253 may be affected.

Figure 3:
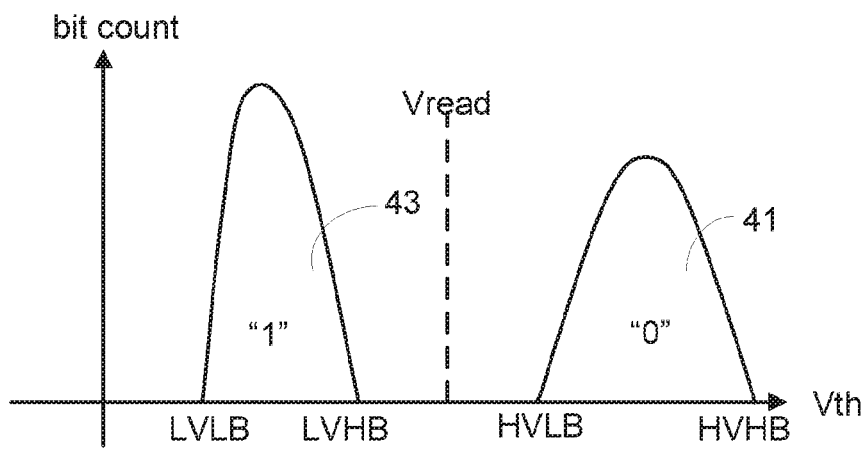
FIG. 3 is a schematic view illustrating cell distribution of an SLC flash memory cell.

FIG. 3 is a schematic view illustrating cell distribution of an SLC flash memory cell. The single-level cell (hereinafter, SLC) memory cell can be programmed between lower bound of high threshold voltage HVLB and upper bound of high threshold voltage HVHB to represent the SLC memory cell is with content "0". In addition, the SLC memory cell can be programmed between lower bound of low threshold voltage LVLB and upper bound of low threshold voltage LVHB to represent the SLC memory cell is with content "1".

A reading voltage Vread is used to determine content stored in the SLC memory cell. The reading voltage Vread is compared with the threshold voltage Vth of the SLC memory cell.

When the threshold voltage Vth is greater than the reading voltage Vread, content in the SLC memory cell is determined to be "0". The left curve 43 indicates that threshold voltage of the SLC memory cell is with content "1".

Similarly, when the threshold voltage Vth is lower than the reading voltage Vread, content in the memory cell is determined to be "1". The right curve 41 indicates that threshold voltage of the SLC memory cell is with content "0".

Theoretically speaking, content of the SLC memory cell is expected to maintain as the distribution of threshold voltage Vth as shown in FIG. 3. However, threshold voltage Vth of the SLC memory cell may be affected even if the SLC memory cell is not programmed or erased.

As mentioned in FIG. 2, when the first memory region 251 is selected to be erased, memory cells in the second memory region will be affected as the first and the second regions share the same well. Thus, after the first memory region is erased, voltage distribution of memory cells in the second memory region are disturbed and seldom remain as the shape shown in FIG. 3. In fact, left boundary corresponding to data content of "0" may probably be lower than the lower bound of high threshold voltage HVLB.

Figure 4A:
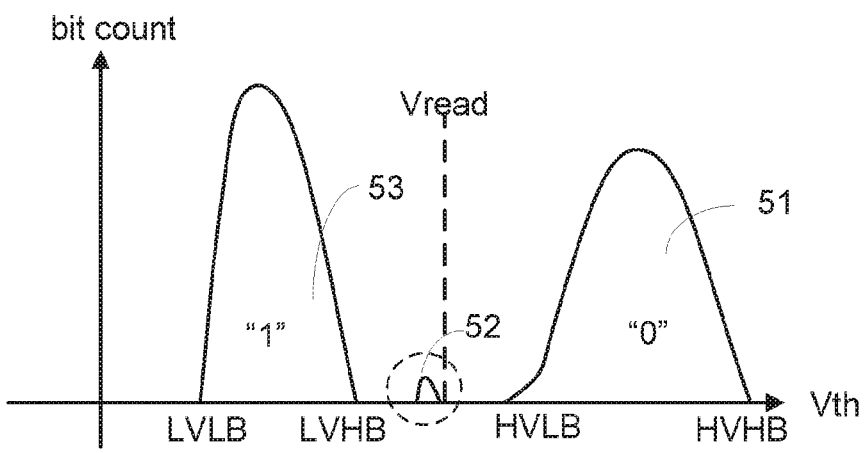
FIG. 4A is a schematic diagram illustrating a type of threshold voltage distribution after an associated memory region is erased.

FIG. 4A is a schematic diagram illustrating a type of threshold voltage distribution after an associated memory region is erased. Generally speaking, shape of the left curve 53 is roughly similar to shape the left curve 43 in FIG. 3, and so as the right curve 51. However, a small curve 52 is shown in between the left curve 53 and the right curve 51.

The curve 52 indicates data content of a memory cell is accidently changed from high threshold voltage Vt to low threshold voltage Vt. In such case, an original data content of "0" stored in the memory cell will be miss-judged as "1" since the threshold voltage of that memory cell is now lower than the reading voltage Vread.

Figure 4B:
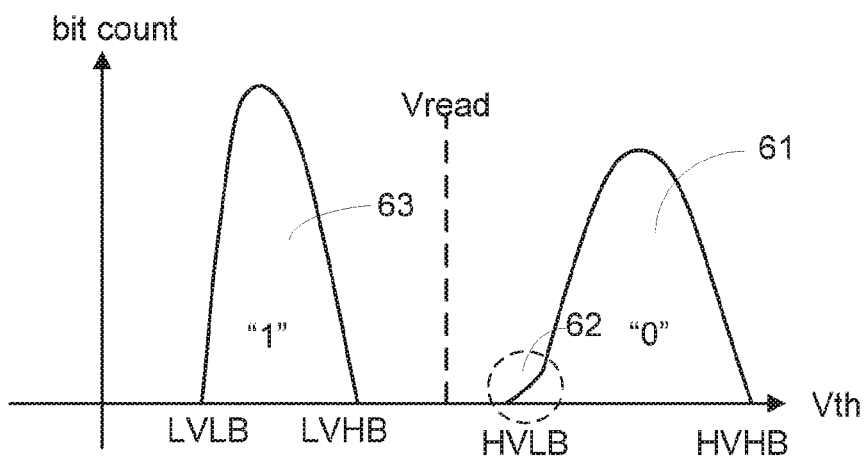
FIG. 4B is another schematic diagram illustrating a type of threshold voltage distribution after an associated memory region is erased.

FIG. 4B is another schematic diagram illustrating a type of threshold voltage distribution after an associated memory region is erased. Generally speaking, shape of the left curve 63 is roughly similar to shape the left curve 43 in FIG. 3, and so as the right curve 61. However, a tail-like portion of the right curve 61 is shown. The tail-like portion of the right curve 61 implies the threshold voltage of the memory cell is slightly shifted when an associated memory region is erased.

Figure 5:
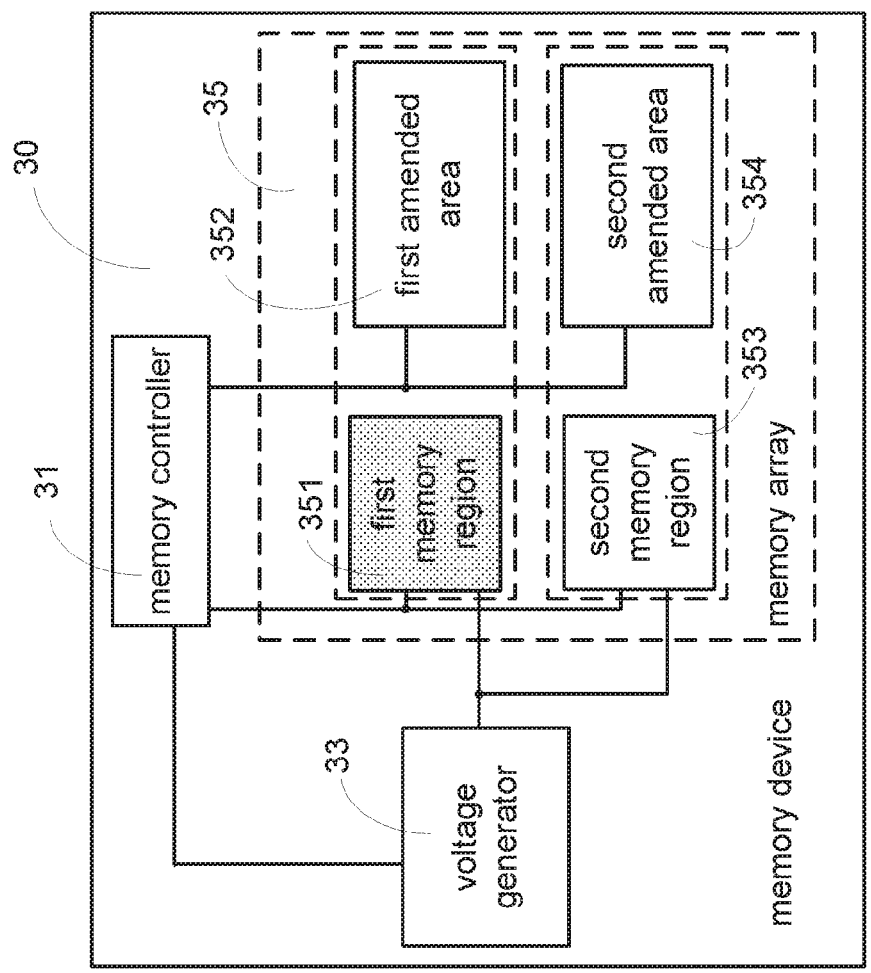
FIG. 5 is a schematic functional block diagram illustrating an exemplary memory device.

FIG. 5 is a schematic functional block diagram illustrating an exemplary memory device. The memory device 30 includes a memory controller 31, a voltage generator 33, and a memory array 35. The memory array 35 includes plural memory regions and each memory region corresponds to an amended area. For instance, the first memory region 351 corresponds to a first amended area 352, and the second memory region 353 corresponds to a second amended area 354.

According to an embodiment of the present invention, each of the amended areas is used to store a plural error correction codes. The error correction codes are retrieved by respectively applying error correction code (hereinafter, EGO) algorithm to pages in the memory region.

That is, contents stored in the first memory region 351 are calculated by ECC algorithm in a unit of page. Thus, a plural first error correction codes corresponding to pages of the first memory region 351 are obtained accordingly. The first error correction codes are stored at the first amended area 352 corresponding to the first memory region 351.

Contents stored in the second memory region 353 are calculated by ECC algorithm in a unit of page. Thus, a plural second error correction codes corresponding to pages of the second memory region 353 are obtained accordingly. The second error correction codes are stored at the second amended area 354 corresponding to the second memory region 353.

In practical application, the plural first error correction codes and the plural second error correction codes are generated by the ECC algorithm prior than an associated memory region is erased. The associated memory region is the memory region shares the same well. For instance, the first and the second memory regions are associated.

Before the first memory region 351 is erased, the ECC algorithm is executed according to content of the second memory region 353 and the plural second error correction codes are consequently stored at the second amended area 354. Similarly, before the second memory region 353 is erased, the ECC algorithm is executed according to content of the first memory region 351 and the plural first error correction codes are stored at the first amended area 352.

The error correction codes can be referred to determine whether contents stored in a memory region are accidently changed when the associated memory region is erased. That is, when the first memory region 351 is erased and the content of the second memory region 353 is accidently affected, the plural second error correction codes stored in the second amended area 354 will be referred and used to correct content of the second memory region 353. When the second memory region 353 is erased and the content of the first memory region 351 is accidently affected, the plural first error correction codes stored in the first amended area 352 will be referred and used to correct content of the first memory region 351.

It is noted that, though the amended areas and the memory regions are drawn separately in FIG. 5, the first amended area 352 may also be a part of the first memory region 351, and the second amended area 354 may also be a part of the second memory region 352. Furthermore, in some scenarios, more than two memory regions will share a well together and concept of the present invention can be applied as well.

Figure 6:
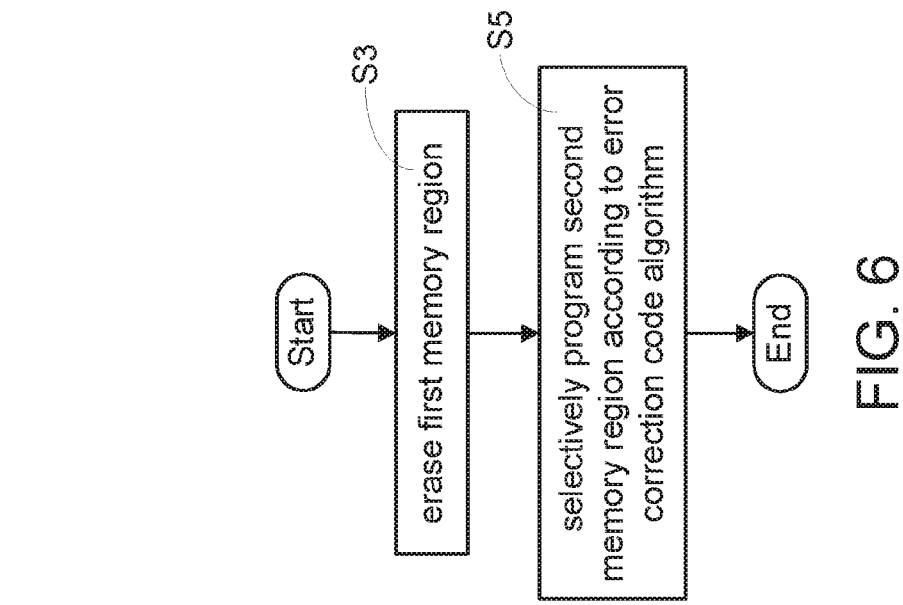
FIG. 6 is an erasing flowchart applied to the flash memory.

FIG. 6 is an erasing flowchart applied to the memory device in FIG. 5. It is assumed that the first memory region 351 is erased and the second memory region 353 is not erased.

Firstly, the first memory region 351 is erased (step S3). Contents stored in memory cells of the second memory region 353 might be simultaneously changed during erasure of the first memory region 351. Thus, the second memory region is selectively programmed according to an error correction code (ECC) algorithm (step S5).

Figure 7:
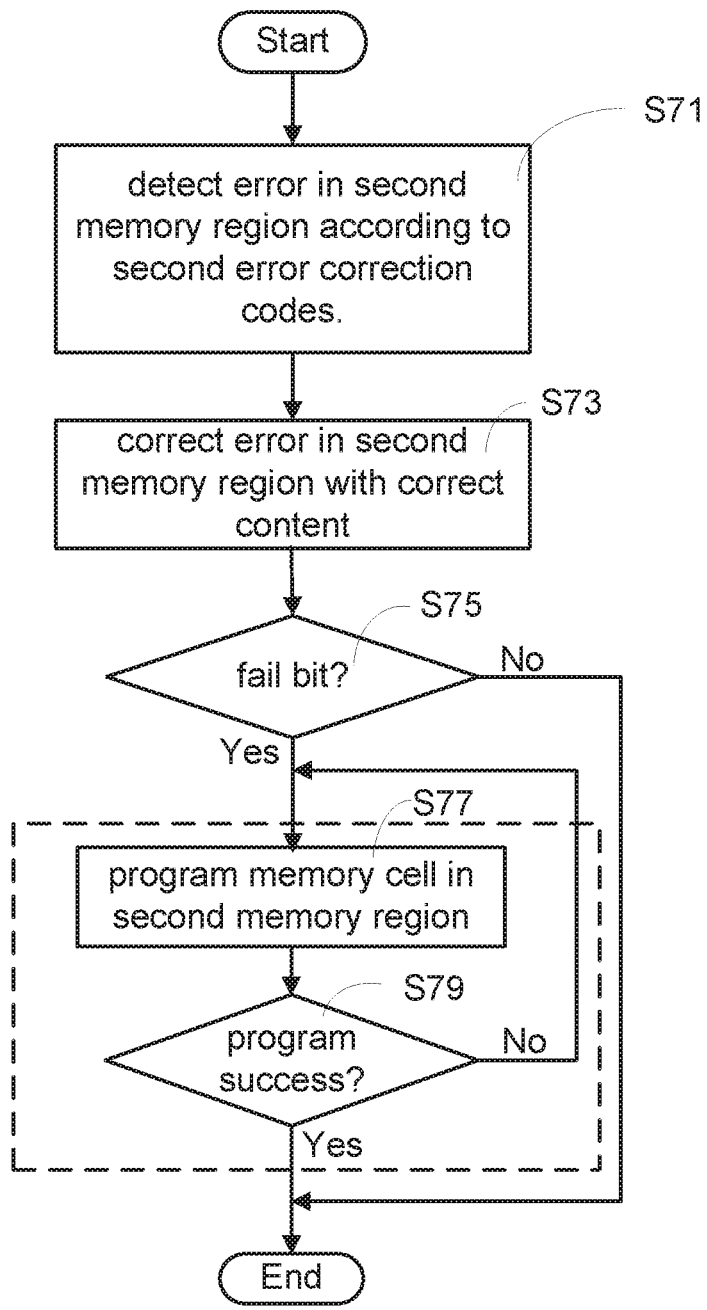
FIG. 7 is a flowchart illustrating how the second memory region is selectively programmed.

Details about step S5 will be illustrated in FIG. 7. In short, FIGS. 7 and 8 programs a memory cell with distribution of FIGS. 4A and 4B so that left boundary corresponding to data content of "0" is higher than the lower bound of high threshold voltage HVLB.

FIG. 7 is a flowchart illustrating how an error correction code algorithm is adopted to avoid forming voltage distribution of FIGS. 4A and 4B. This flow corrects the situations that left boundary corresponding to data content of "0" is lower than the reading voltage Vread. It is noted that flow of FIG. 7 will be applied to each of the small units (e.g. pages) of the second memory region and will be repeatedly executed.

ECC algorithm provides both error detection and error correction functions. Error detection function implies the detection of errors, while error correction provides the ability to reconstruct the original data. The amended areas 352 and 354 are provided to store ECC which are corresponding to correct contents of small units (e.g. pages) of the memory region. The ECC enable the ECC algorithm to determine whether the run-time data contents stored in the second memory region 353 are correct. The ECC algorithm may be implemented by hardware or software.

ECC algorithm is executed to detect if any error exists in the second memory region by referring to the plural second error correction codes (step S71). Then, if the data content is affected by erasing of an associated memory region and data content of "0" is misjudged as "1", the mistake can be corrected with correct content by executing the ECC algorithm (step S73).

ECC is a mechanism that can detect and correct a certain number of errors and types of the ECC algorithm applied here are not limited. For instance, the ECC algorithm may generate the error correction codes in the form of Hamming codes, Hsiao codes, Reddy codes, finite field-based codes, Reed-Solomon code, or Bose-Chaudhuri-Hocquenghem codes etc.

Furthermore, the situations that left boundary corresponding to data content of "0" is higher than the reading voltage Vread but lower than the lower bound of high threshold voltage HVLB will be examined and corrected.

Whereas, if the threshold voltage of the memory cell is greater than the reading voltage Vread, the memory cell is determined to be with a high threshold voltage Vt. Then, the memory cell will be selectively programmed according to comparison of the threshold voltage Vth and a programming voltage Vpgm.

The threshold voltage Vth is compared with the programming voltage Vpgm (step S75). If the threshold voltage Vth is greater than the programming voltage Vpgm, determination result of step S75 is negative and the flow of FIG. 7 terminates.

Whereas, if the threshold voltage Vth is lower than the programming voltage Vpgm, the memory cell is determined to contain a fail bit. Thus, the determination result of step S75 is positive, and the threshold voltage Vth of the memory cell in the second memory region 353 is programmed to the higher voltage level (step S77).

After being programmed, the memory cell in the second memory region 353 may be further checked if the programming is success (S79). If not, the memory cell in the second memory region 353 will be programmed again (step S77).

According to the illustrations above, with assistance of flow in FIG. 7, threshold voltage distributions corresponding to the second memory region 353 are finely adjusted so that correctness of reading contents of the second memory region 353 is guaranteed.

Similarly, if the second memory region 353 is the one to be erased, the first memory region 351 will be selectively programmed and recovered according to the ECC algorithm. It should be noted that the above concept can be applied to more number of memory regions even if only two memory regions are explained for the sake of convenience.

Figure 8A:
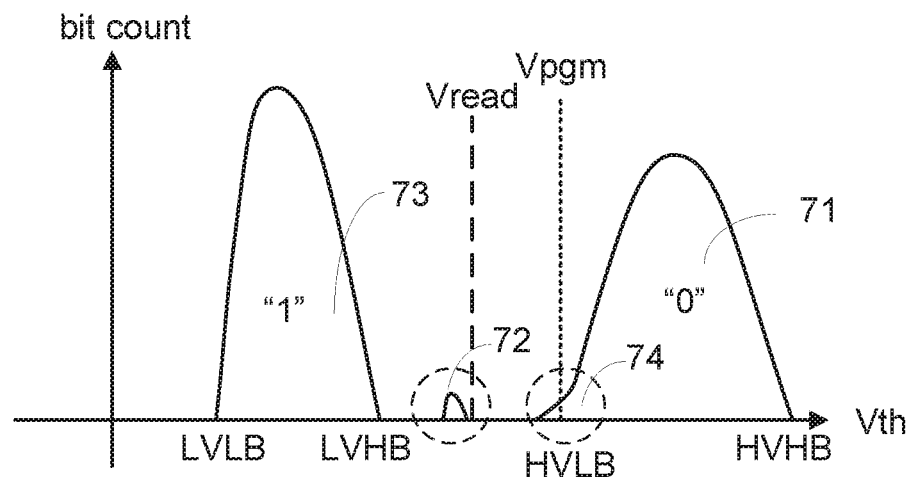
FIG. 8A is a schematic view of voltage distribution before flowchart of FIG. 7 is executed; and, FIG. 8B is a schematic view of voltage distribution after flowchart of FIG. 7 is executed.

FIG. 8A is a schematic view of voltage distribution before flowchart of FIG. 7 is executed. The left curve 73 and the right curve 71 respectively represent contents of "1" and "0". A middle curve 72 and a tail-like portion 74 of the right curve 71 may be generated.

Figure 8B:
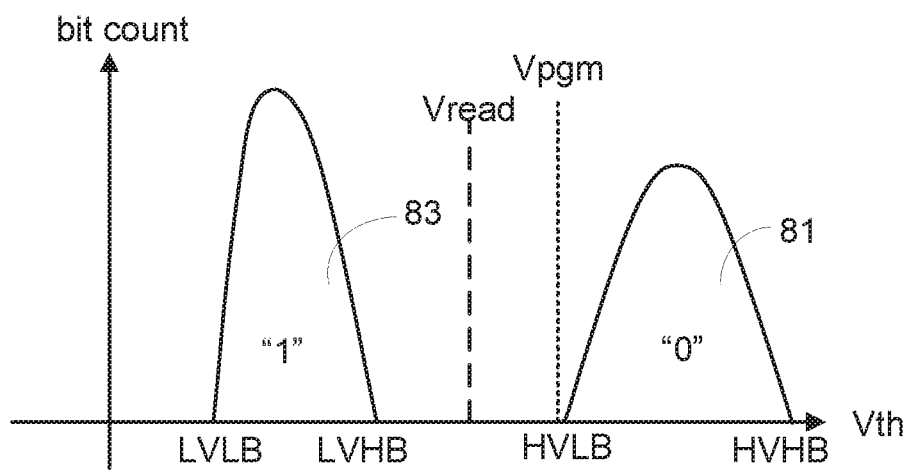

FIG. 8B is a schematic view of voltage distribution after flowchart of FIG. 7 is executed. After the step of selectively programming, the left curve 83 and the right curve 81 are like the ones in FIG. 3. Therefore, the possibility of unexpected data loss accompanied by erasing the first memory region 351 is dramatically reduced.

Flash memories can be classified according to internal design of their memory cells. For instance, a flash memory may be an SLC, or multi-level cell (hereinafter, MLC) such as double-level cell, triple-level cell (hereinafter, TLC), quadruple-level cell etc. The above embodiment is based on illustrations of an SLC type flash memory, but similar phenomenon also exists in MLC type flash memories. Thus, the concept of the present invention may be applied to MLC type flash memories as well.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An operation method of a memory device comprising a memory array, having a first memory region and a second memory region, wherein the first memory region and the second memory region share a well, the operation method comprising steps of:
   erasing the first memory region; and
   programming the second memory region when a memory cell in the second memory region contains a fail bit.

2. The operation method as claimed in claim 1, wherein the memory cell contains the fail bit if a threshold voltage of the memory cell is lower than a programming voltage.

3. The operation method as claimed in claim 2, wherein a second amended region corresponding to the second memory region stores a plurality of second error correction codes, wherein the plurality of second error correction codes are generated according to content of the second memory region.

4. The operation method as claimed in claim 3, wherein the plurality of second error correction codes are referred and used to correct the content of the second memory.

5. The operation method as claimed in claim 2, wherein the fail bit represents content of the memory cell is accidently affected when the first memory region is erased, and the operation method further comprises a step of:
   detecting the fail bit according to a plurality of second error correction codes.

6. The operation method as claimed in claim 5, further comprising a step of:

programming the memory cell so that the threshold voltage of the memory cell is higher than the programming voltage and the fail bit is corrected.

7. The operation method as claimed in claim 5, wherein the step of programming the second memory region further comprises steps of:
correcting error in the second memory region with correct content, wherein the correct content is generated according to the plurality of second error correction codes and an error correction algorithm.

8. The operation method as claimed in claim 1, wherein the memory device is a NAND flash memory device or a NOR flash memory device.

9. The operation method as claimed in claim 1, wherein memory cells in the memory device are single-level cells (hereinafter, SLC), or multiple-level cells (hereinafter, MLC).

10. The operation method as claimed in claim 1, wherein the well is a p-well or an n-well.

11. A memory device, comprising:
a memory controller; and
a memory array, electrically connected to the memory controller and comprising a first memory region and a second memory region sharing a well, wherein the first memory region is erased by the memory controller and the second memory region is programmed when a memory cell in the second memory region contains a fail bit, wherein the memory cell contains the fail bit if a threshold voltage of the memory cell is lower than a programming voltage.

12. The memory device as claimed in claim 11, wherein the memory controller generates a plurality of second error correction codes and stores the plurality of second error correction codes to a second amended region corresponding to the second memory region.

13. The memory device as claimed in claim 12, wherein the memory controller refers and uses the plurality of second error correction codes to correct the content of the second memory.

14. The memory device as claimed in claim 11, wherein the fail bit represents content of the memory cell is accidently affected when the first memory region is erased, and the memory controller detects the fail bit according to a plurality of second error correction codes.

15. The memory device as claimed in claim 14, wherein the memory controller programs the memory cell so that the threshold voltage of the memory cell is higher than the programming voltage and the fail bit is corrected.

16. The memory device as claimed in claim 14, wherein the memory controller corrects error in the second memory region with correct content, wherein the correct content is generated according to the plurality of second error correction codes and an error correction algorithm.

17. The memory device as claimed in claim 11, wherein the memory device is a NAND flash memory device or a NOR flash memory device.

18. The memory device as claimed in claim 11, wherein memory cells in the memory device are single-level cells (hereinafter, SLC), or multiple-level cells (hereinafter, MLC).

19. The memory device as claimed in claim 11, wherein the well is a p-well or an n-well.

* * * * *